(12) United States Patent
Ooyama et al.

(10) Patent No.: US 6,191,494 B1
(45) Date of Patent: Feb. 20, 2001

(54) SEMICONDUCTOR DEVICE AND METHOD OF PRODUCING THE SAME

(75) Inventors: Nobuo Ooyama; Shinichiro Maki; Fumitoshi Fujisaki; Syunichi Kuramoto; Yukio Saigo; Yasuo Yatsuda; Youichi Matae; Atsushi Yano, all of Satsuma-gun; Kazuto Tsuji, Kawasaki; Masafumi Tetaka, Satsuma-gun, all of (JP)

(73) Assignee: Fujitsu Limited, Kawasaki (JP)

( * ) Notice: Under 35 U.S.C. 154(b), the term of this patent shall be extended for 0 days.

(21) Appl. No.: 09/342,500

(22) Filed: Jun. 29, 1999

(30) Foreign Application Priority Data

Jun. 30, 1998 (JP) .................................................. 10-183988

(51) Int. Cl.[7] .......................... H01L 23/28; H01L 23/495; H01L 23/50; H01L 29/41; C23C 14/14
(52) U.S. Cl. .......................... 257/796; 257/684; 257/788; 257/693; 257/692; 257/696; 257/698; 257/675; 257/712; 257/713; 257/730; 257/707; 257/676; 361/808; 361/813
(58) Field of Search ...................................... 257/690, 675, 257/691–693, 696, 698, 796, 712, 717, 720, 666, 676, 784, 684, 787, 788, 667, 706–708, 713, 730; 362/813, 808

(56) References Cited

U.S. PATENT DOCUMENTS

| | | | |
|---|---|---|---|
| 5,172,214 | * 12/1992 | Casto | 257/676 |
| 5,355,283 | * 10/1994 | Marrs et al. | 257/787 |
| 5,416,662 | * 5/1995 | Kurasawa et al. | 361/118 |
| 5,521,429 | * 5/1996 | Aono et al. | 257/676 |
| 5,612,576 | * 3/1997 | Wilson et al. | 257/788 |
| 5,835,988 | * 11/1998 | Ishii | 257/684 |
| 5,894,108 | * 4/1999 | Mostafazadeh et al. | 257/684 |
| 5,900,676 | * 5/1999 | Kweon et al. | 257/787 |
| 5,942,796 | * 8/1999 | Mosser et al. | 257/712 |
| 5,977,630 | * 11/1999 | Woodworth et al. | 257/712 |
| 6,013,945 | * 1/2000 | Haghiri-Tehrani | 257/672 |
| 6,025,640 | * 2/2000 | Yagi et al. | 257/666 |

* cited by examiner

Primary Examiner—Alexander O. Williams
(74) Attorney, Agent, or Firm—Armstrong, Westerman, Hattori, McLeland & Naughton

(57) ABSTRACT

A semiconductor device and a method of producing the same are provided. The semiconductor device includes: a semiconductor chip; a resin package which seals the semiconductor chip; signal passages which guide the signal terminals of the semiconductor chip outward from the resin package; a grounding metal film in contact with the bottom surface of the semiconductor chip; and a grounding passage which is connected to the grounding metal film and guided outward from the resin package.

8 Claims, 12 Drawing Sheets

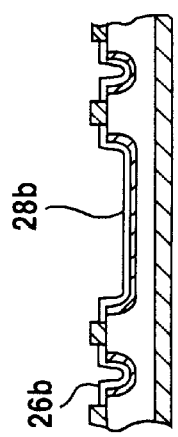
FIG.5A
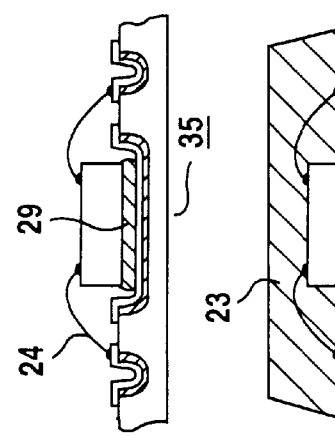
FIG.5B
FIG.5C
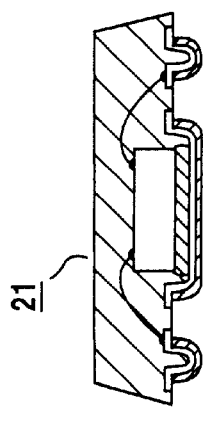
FIG.5D
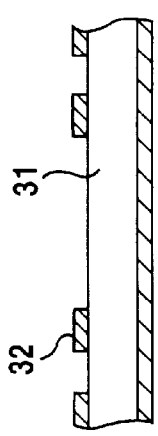
FIG.5E
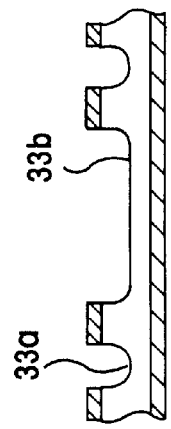
FIG.5F
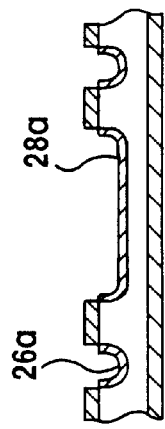
FIG.5G
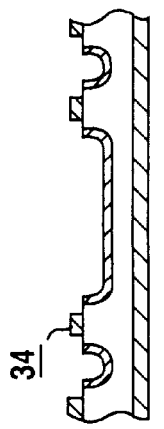
FIG.5H

SEMICONDUCTOR DEVICE AND METHOD OF PRODUCING THE SAME

BACKGROUND OF THE INVENTION

1. Field of the Invention

The present invention relates to a semiconductor device and a method of producing the same.

2. Description of the Related Art

In recent years, semiconductor devices have been becoming smaller and more highly integrated. Along with this trend, more and more wrong operations and unstable characteristics are seen in a semiconductor device due to interference between regions having different functions.

In view of this, there has been an increasing demand for semiconductors in which no interference is caused between regions having different functions.

FIGS. 11A and 11B are a sectional view and a perspective view of a conventional semiconductor device. A CSP (Chip Size Package) semiconductor device is shown in the figures.

In a conventional semiconductor device 81 shown in FIG. 11A, a semiconductor chip 82 is sealed in a resin package 83. Signal terminals on the surface of the semiconductor chip 82 are electrically connected to mounting protrusions 85 protruding from the bottom surface of the resin package 83 by wires 84.

The surfaces of the mounting protrusions are covered with metal films 86, and the bottom surface of the semiconductor chip 82 is coated with an insulating adhesive 89.

As shown in FIG. 11B, the semiconductor chip 82 is situated in the center of the semiconductor device 81, and the metal films 86 (or the mounting protrusions 85) are situated in the surrounding area of the semiconductor chip 82. The metal films 86 are connected to the signal terminals of the semiconductor chip 82 by the wires 84.

The signal terminals of the semiconductor chip 82 include terminals which input and output various signals, and a grounding terminal which serves as a reference potential.

Since semiconductor devices have been becoming smaller and more highly integrated, regions having various functions exist in a small area. FIG. 12 is an enlarged sectional view of a part of the conventional semiconductor device, illustrating the problems in the prior art.

The semiconductor device 81 shown in FIG. 12 has a PLL (Phase Locked Loop) circuit, for instance. The semiconductor chip 82 contains a plurality of functional regions including a first functional region 90 and a second functional region 91. The functional regions are formed with a semiconductor substrate 87 as a base, and are divided by isolators 92.

A wiring pattern 93 is formed on the surfaces of the first functional region 90 and the second functional region 91, and a part of the wiring pattern 93 is connected to a grounding terminal 94 which is a reference potential. The grounding terminal 94 also serves to release small noise existing inside the semiconductor substrate 87, and is formed on one of the isolators 92.

The bottom surface of the semiconductor chip 82, i.e., the bottom surface of the semiconductor substrate 87, is coated with the insulating adhesive 89.

Since the semiconductor device 81 is extremely small and highly integrated, the first functional region 90 and the second functional region 91 are disposed in an extremely small area, though they have different functions.

In the PLL circuit, frequency conversion is performed by a divider to generate a plurality of frequencies. For instance, the first functional region 90 operates on a frequency f1, while the second functional region 91 operates on a different frequency f2.

With such a structure, the frequency leaking from each region turns into noise that enters the neighboring functional region, as indicated by arrows in FIG. 12. The noise often results in unstable characteristics or wrong operations.

The grounding terminal 94 disposed on the isolator 92 cannot release enough noise, because the first functional region 90 and the second functional region 91 are too close to each other. It is possible to release all noise by forming a plurality of grounding terminals at short intervals, but such a measure is not suitable for the highly-integrated small-size semiconductor device.

SUMMARY OF THE INVENTION

A general object of the present invention is to provide a semiconductor device and a method of producing the same in which the above disadvantages can be eliminated.

A more specific object of the present invention is to provide a highly integrated small semiconductor device in which adverse influence due to interference between different functional regions are prevented to achieve stable operations.

The above objects of the present invention are achieved by a semiconductor device which includes: a semiconductor chip: a resin package which seals the semiconductor chip; signal passages which guide signal terminals of the semiconductor chip outward from the resin package; a grounding metal film in contact with a bottom surface of the semiconductor chip; and a grounding passage which is connected to the grounding metal film and is guided outward from the resin package.

In this structure, the grounding metal film is in contact with the bottom surface of the semiconductor chip, so that unnecessary electric signals in the semiconductor chip are absorbed by the metal film and released outward. Thus, wrong operations due to interference between regions having different functions can be prevented.

The resin package of the semiconductor device has a plurality of mounting protrusions covered with metal films. The metal films on the mounting protrusions and the signal terminal of the semiconductor chip are connected by conductive wires to form the signal passages.

In this structure, there is no need to employ lead terminals extending outward from the semiconductor chip, and the mounting protrusions covered with the metal films serve as outer terminals immediately below the semiconductor chip. Thus, the semiconductor device can remain small in size, and unnecessary noise in the semiconductor chip can be released to the outside.

The above objects of the present invention are also achieved by a method of producing a semiconductor device in which a semiconductor chip is sealed in a resin package having a plurality of mounting protrusions so that signal terminals of the semiconductor chip are guided outward from the mounting protrusions. This method includes the steps of: attaching metal films onto the inner surfaces of concavities corresponding to the mounting protrusions, and to a semiconductor chip mounting surface surrounded by the concavities formed in a base; mounting the semiconductor chip onto the metal film surrounded by the concavities via a conductive adhesive; electrically connecting the signal terminals of the semiconductor chip to the metal films on the inner surfaces of the concavities by conductive wires; sealing the semiconductor chip and the conductive wires with resin; and detaching the base from the metal films on the inner surfaces of the concavities and the semiconductor chip mounting surface.

By this method, the grounding metal film can be formed at the time of the formation of the metal films on the mounting protrusions as the outer signal terminals. Thus, unnecessary noise in the semiconductor chip can be removed without complicating the production procedures.

The above and other objects and features of the present invention will become more apparent from the following description taken in conjunction with the accompanying drawings.

BRIEF DESCRIPTION OF THE DRAWINGS

FIGS. 5A to 5H are sectional views illustrating the production procedures of the second embodiment of the present invention;

DESCRIPTION OF THE PREFERRED EMBODIMENTS

The following is a description of embodiments of the present invention, with reference to the accompanying drawings.

Figure 1A:
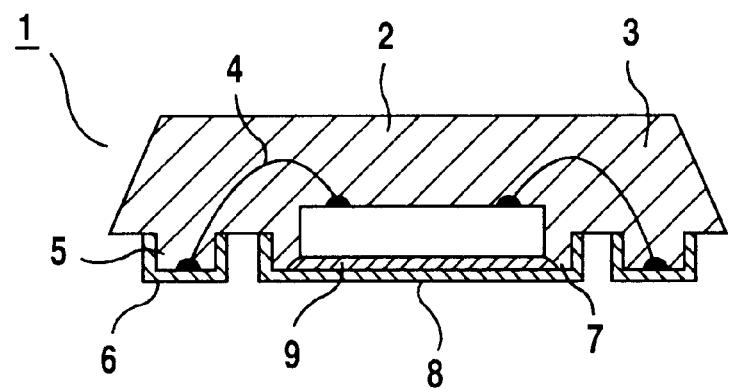
FIGS. 1A and 1B are a sectional view and a bottom view of a semiconductor device of a first embodiment of the present invention.

A semiconductor device 1 of this embodiment is a CSP (Chip Size Package) having no lead terminals. As shown in FIG. 1A, a resin package 3 is provided with mounting protrusions 5 and a grounding protrusion 7, and a semiconductor chip 2 is disposed inside the grounding protrusion 7. The mounting protrusions 5 and the grounding protrusion 7 are covered with metal films 6 and a metal film 8, respectively.

Signal terminals formed on the surface of the semiconductor chip 2 are electrically connected to the metal films 6 on the surfaces of the mounting protrusions 5 of the resin package 3 by wires 4.

The bottom surface of the semiconductor chip 2 sealed in the grounding protrusion 7 of the resin package 3 is electrically in contact with the metal film 8 by a conductive adhesive 9.

Figure 1B:
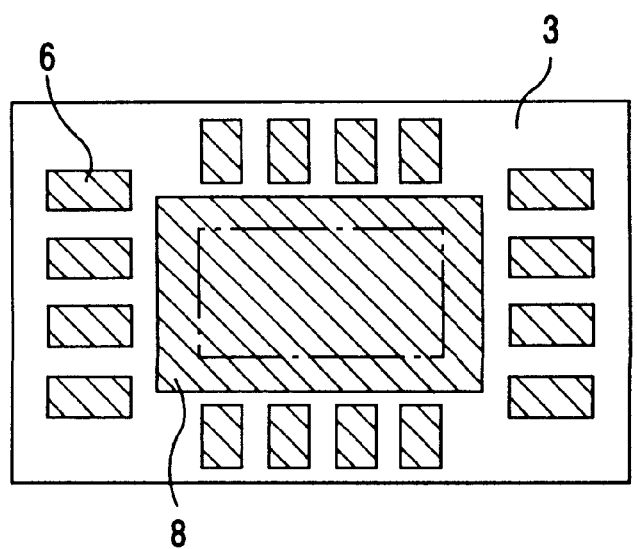

As shown in the bottom view in FIG. 1B, the metal film 8 corresponding to the grounding protrusion 7 is formed in the center of the semiconductor device 1. The metal films 6 corresponding to the mounting protrusions 5 are formed around the metal film 8. The semiconductor chip 2 is sealed in the resin package 3 as indicated by a dot-and-dash line in the metal film 8.

In this embodiment, the semiconductor chip 2 has a semiconductor substrate made of silicon, for instance, as a base. The conductive adhesive 9 on the bottom surface of the semiconductor chip 2 is silver paste. With this structure, a grounding passage from the semiconductor substrate is formed via the silver paste.

Referring now to FIGS. 2A to 2H, a method of producing the above semiconductor device will be described below.

Figure 2A:
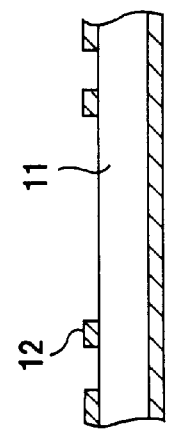
FIGS. 2A to 2H are sectional views illustrating the production procedures of the first embodiment of the present invention.

As shown in FIG. 2A, a resist 12 having a predetermined pattern is attached to the upper surface of a metal plate made of copper, for instance. A resist covers the entire lower surface of the metal plate 11.

Figure 2B:
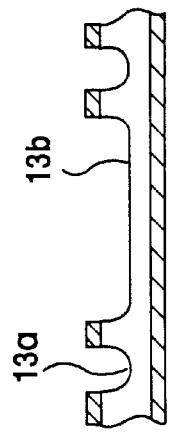

The exposed portions of the metal 11 are etched, with the resist 12 serving as a mask, so that concavities 13a and 13b are formed as shown in FIG. 2B. Here, a cover pattern may be formed on the resist 12 depending on the adjustment of the speed of the etching, i.e., the area in which the etching is performed to form concavities having the same depth.

Figure 2C:
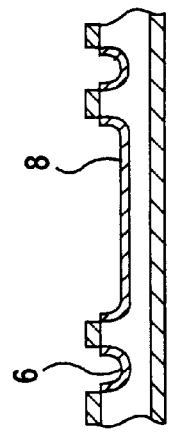

The concavities 13a and 13b formed by the etching are then plated, so that the metal films 6 and 8 shown in FIG. 2C are formed. The metal films 6 and 8 have a multi-layered structure to obtain adhesion and strength with a conductive material (soldering) used at the time of mounting.

Figure 2D:
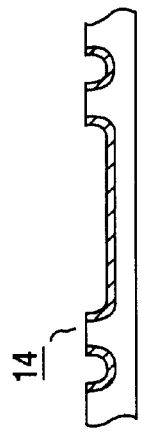

The resist 12 is then removed so that a lead frame shown in FIG. 2D is completed.

Figure 2E:
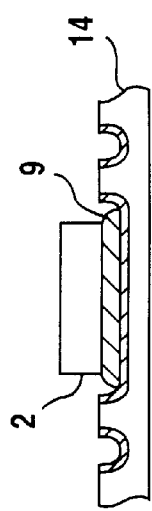

As shown in FIG. 2E, The semiconductor chip 2 is mounted on the metal film 8 in a position corresponding to the concavity 13b of the lead frame 14. Here, the conductive adhesive 9 made of silver paste is interposed between the metal film 8 and the semiconductor chip 2. The silver paste includes a dilution of epoxy or the like, which might cause a blur. This can be prevented by forming non-plated portions on the metal film pattern. By doing so, the resin of the resin package is brought into contact with the non-plated portions to prevent a blur.

Figure 2F:
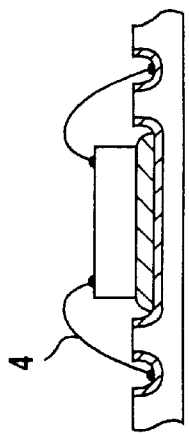

After the semiconductor chip 2 is mounted, the signal terminals on the surface of the semiconductor chip 2 and the metal films 6 corresponding to the concavities 13a are electrically connected by bonding the wires 4, as shown in FIG. 2F.

Figure 2G:
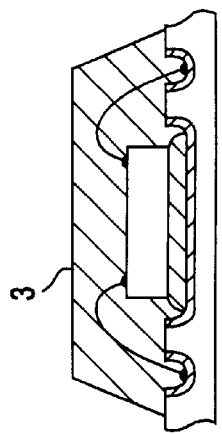

The resin package 3 is then formed, as shown in FIG. 2G, by a sealing technique using a conventional metal mold.

Figure 2H:
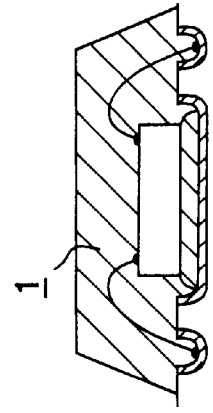

Finally, the metal plate 11 is removed by etching, and the semiconductor device 1 is completed as shown in FIG. 2H.

In the production method of this embodiment, individual semiconductor devices can be formed separately from each other, but it is more efficient to simultaneously produce a plurality of semiconductor devices connected to each other. The lead frame 14 shown in FIG. 2D is a matrix-type lead frame, and a plurality of semiconductor chips 2 are mounted on the lead frame 14. After the resin sealing and the metal plate removal are carried out, the lead frame 14 is diced to simultaneously produce the individual semiconductor devices 1.

Figure 3:
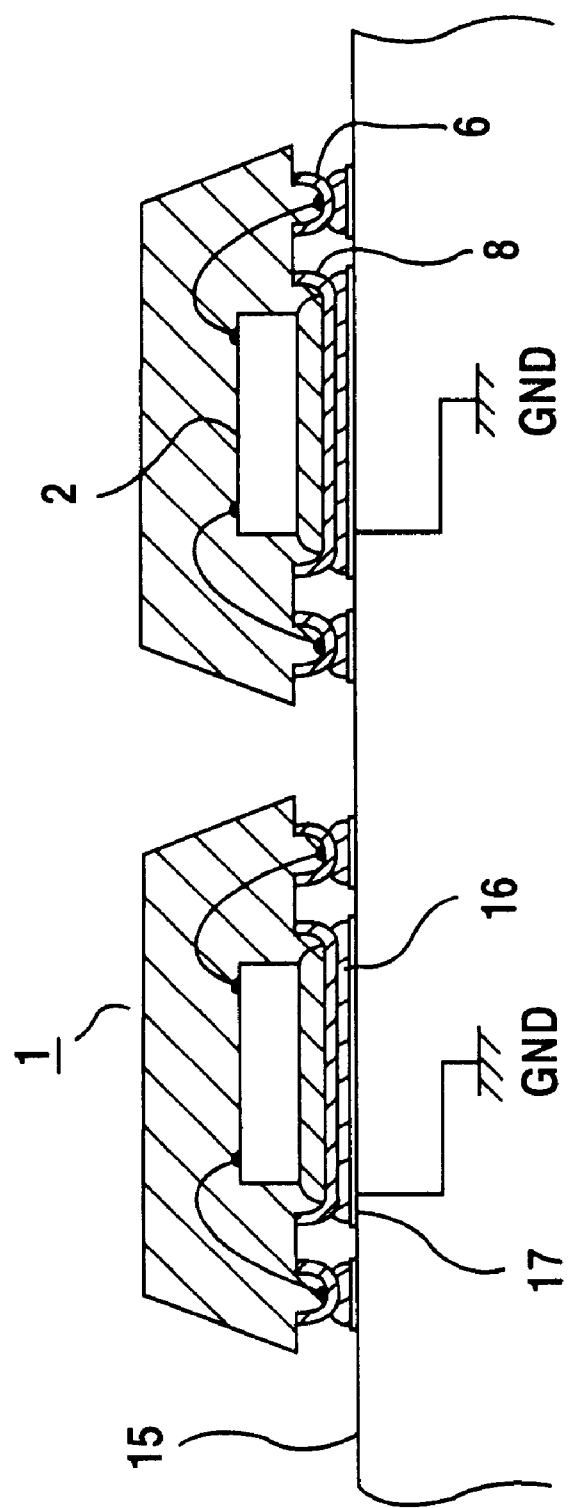
FIG. 3 is a sectional view of mounted semiconductor devices of the first embodiment of the present invention.

FIG. 3 illustrates mounted semiconductor devices 1 produced by the above production method.

The metal films 6 and 8 corresponding to the mounting protrusions 5 and the grounding protrusion 7 of each of the semiconductor devices 1 are brought into contact with mounting regions 17 of a printed circuit board 15 via a conductive material. Thus, each semiconductor device 1 is mounted onto the printed circuit board 15.

The mounting region 17, with which the metal film 8 on the grounding protrusion 7 is in contact, is grounded. Although the grounding is only schematically shown in FIG. 3, the metal film 8 is actually grounded to a grounding portion via a wiring pattern formed on the surface of the printed circuit board 15.

Each of the semiconductor chips 2 has various functional regions, and noise from each of the functional regions leaks to the semiconductor substrate. In the semiconductor device 1 of this embodiment, however, the noise leaking from the semiconductor chip 2 to the semiconductor substrate is transferred to the metal film 8 of the grounding protrusion 7 via the conductive adhesive 9. Thus, adverse influence between the functional regions can be prevented.

A grounding region having a large area is formed near the noise generating portion in the semiconductor substrate. With this grounding region, the noise leaked from the various functional regions to the semiconductor substrate can be discharged prior to reaching the adjacent functional regions. Thus, wrong operations due to interference in the semiconductor device can be avoided to obtain stable characteristics.

Referring now to FIGS. 4A to 6, a second embodiment of the present invention will be described below.

This embodiment is basically the same as the first embodiment, except that flat regions are formed for wire bonding of the terminals.

Figure 4A:
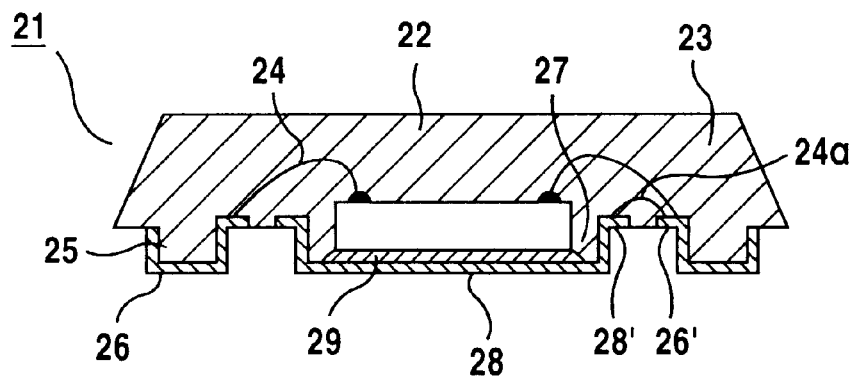
FIGS. 4A and 4B are a sectional view and a perspective view of a semiconductor device of a second embodiment of the present invention.

As shown in FIG. 4A, a semiconductor chip 22 is disposed inside a grounding protrusion 27 of a resin package 23 having mounting protrusions 25 and the grounding protrusion 27. Metal films 26 and 28 cover the surfaces and the neighborhood areas of the mounting protrusions 25 and the grounding protrusion 27, respectively. The neighborhood areas of the metal films 26 and 28 are flat regions 26' and 28'.

Signal terminals on the surface of the semiconductor chip 22 and the flat regions 26' of the metal films 26 are electrically connected by wires 24. The bottom surface of the semiconductor chip 22 sealed in the grounding protrusion 27 of the resin package 23 is electrically brought into contact with the metal film 28 via a conductive adhesive 29.

Figure 4B:
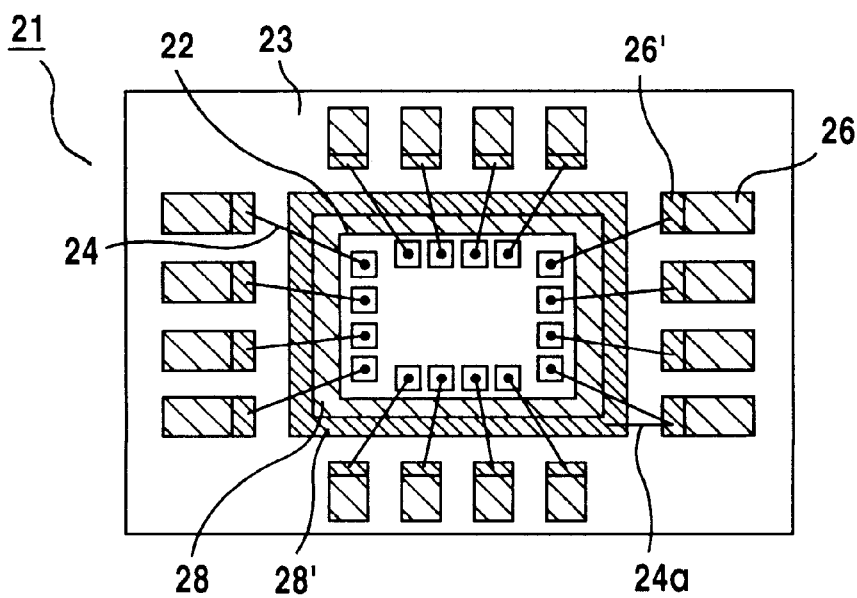

As shown in FIG. 4B, the metal film 28 corresponding to the grounding protrusion 27 is formed in the center of a semiconductor device 21, and the metal films 26 corresponding to the mounting protrusions 25 are formed in the surrounding area of the metal film 28.

The flat regions 26' and 28' are formed in the neighborhood areas of the metal films 26 and 28, respectively. The flat regions 26' and 28' are used for wire bonding, and the functions of them will be described later.

As in the first embodiment, the semiconductor chip 22 of this embodiment has a semiconductor substrate made of silicon or the like as a base. The conductive adhesive 22 on the bottom surface of the semiconductor chip 22 is silver paste. With this structure, a grounding passage from the semiconductor substrate is formed via the silver paste.

Referring now to FIGS. 5A to 5H, a production method of this embodiment will be described below.

As shown in FIG. 5A, a first resist 32 having a predetermined pattern is attached onto the surface of a metal plate 31 made of copper or the like. The entire bottom surface of the metal plate 31 is covered with a resist.

With the first resist 32 serving as a mask, the exposed portions of the metal plate 31 are etched to form concavities 33a and 33b as shown in FIG. 5B.

The inner surfaces of the concavities 33a and 33b are then plated to form first metal films 26a and 28a as shown in FIG. 5C.

The first resist 32 is then partially removed, or the first resist 32 is replaced with a resist having a different pattern, thereby forming a second resist 34 as shown in FIG. 5D.

With the second resist 34 serving as a mask, the exposed portions are again plated to form second metal films 26b and 28b as shown in FIG. 5E. The neighborhood areas of the second films 26b and 28b are the flat regions described above with reference to FIGS. 4A and 4B.

As shown in FIG. 5F, the resist on the bottom surface and the second resist 34 are removed, thereby completing a lead frame 35. The semiconductor chip 22 is then mounted on the metal film 28 corresponding to the concavity 33b of the lead frame 35 via the conductive adhesive 29 made of silver paste. The signal terminals on the surface of the semiconductor chip 22 and the flat regions of the second metal films 26b corresponding to the concavities 13a are electrically connected by the wires 24.

The resin package 23 is then formed by a conventional sealing technique using a metal mold, as shown in FIG. 5G.

Finally, the metal plate 31 is removed by etching, thereby completing the semiconductor device 21, as shown in FIG. 5H.

In the production method of this embodiment, a plurality of semiconductor devices 21 are simultaneously produced and then diced.

As described above, the first metal films 26a and 28a, and the second metal films 26b and 28b, are formed with the first resist 32 and the second resist 34 serving as the masks in this embodiment. The second metal films 26b and 28b are provided with the respective flat regions, and the wires 24 are connected to the flat regions.

With this structure, wire bonding can be easily carried out, because it is easier to connect the wires to the flat regions outside the concavities 33a than to the metal films on the inner surfaces of the concavities 33a.

More specifically, since each of the concavities 33a is formed by etching a small portion of the metal plate 31, it has a hemispherical shape without a flat surface. It is difficult to secure a wire to such a hemispherical surface, and therefore, it is necessary to form a conductive ball for connecting a wire in each of the concavities 33a in advance.

In this embodiment, on the other hand, the wires 24 are connected to the flat regions of the second metal films 26b electrically connected to the first metal films 26a on the inner surfaces of the concavities 33a. Thus, the wire bonding can be simpler and more accurate.

The concavity 33b for mounting the semiconductor chip 22 is also provided with the second metal film 28b having a flat region. The second metal films 26b are wire-bonded to the second metal film 28b, so that even when the first metal film 28a in the concavity 33b is not in electrical contact with the printed circuit board, grounding can be carried out via the first metal films 26a in the concavities 33a.

As shown in FIG. 4B, a wire 24a connects one of the flat regions 26' to the flat region 28'. Here, the metal film 26 connected to the wire 24a is originally formed as a grounding terminal.

Figure 6:
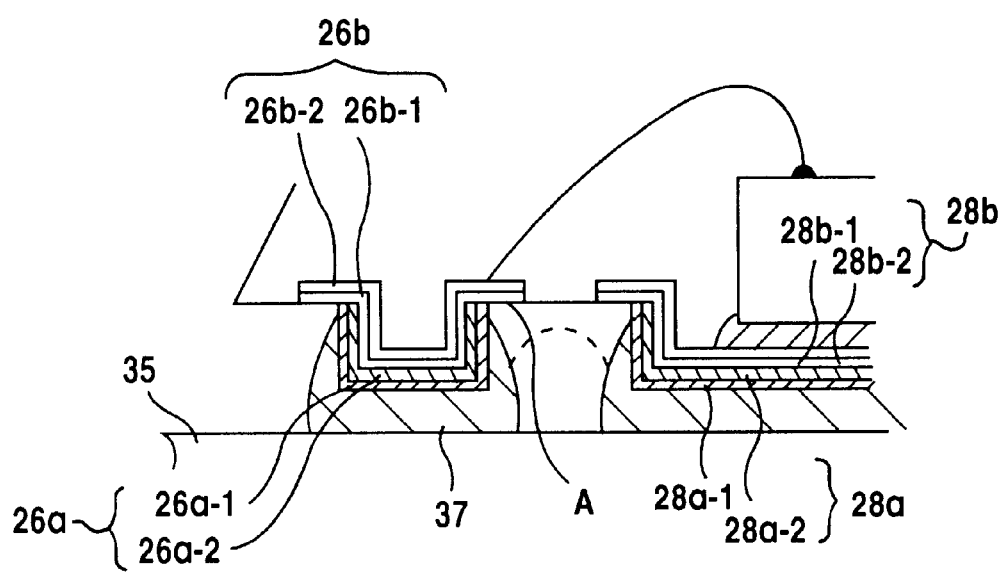
FIG. 6 is a partially enlarged view of the semiconductor device of the second embodiment of the present invention.

FIG. 6 is a partially enlarged view illustrating the structure of the metal films of the semiconductor device of the second embodiment.

As shown in FIG. 6, each of the first metal films 26a corresponding to the mounting protrusions 25 (shown in FIG. 4A) consists of a Au film 26a-1 and a Pd film 26a-2, and each of the second metal films 26b is made of a Ni film 26b-1 and a Pd film 26b-2. The first metal films 28a and the second metal film 28b corresponding to the grounding protrusion 27 have the same multi-layered structure as the first metal films 26a and the second metal films 28a, respectively.

The multi-layered structure is employed in this embodiment for its conductivity, film strength, and bonding ability. The Au films 26a-1 and 28a-1 of the first metal layers 26a and 28a have excellent bonding ability with a conductive material 37. On the other hand, the Ni films 26b-1 and 28b-1 of the second metal films 26b and 28b have poor bonding ability with the conductive material 37. The Pd films 26a-2, 28a-2, 26b-2, and 28b-2 adjust the conductivity in the metal films as a whole, and maintain the film strength. The Pd films also have good bonding ability with the wires.

When mounting the semiconductor device 21 onto the printed wiring board 35, the contact surface must have excellent bonding ability with the conductive material 37 to obtain reliable mounting. This is the reason that the Au films 26a-1 and 28a-1 are employed.

Meanwhile, a portion indicated by A in FIG. 6 is exposed, and this portion might be brought into contact with the conductive material 37 when mounting is carried out. If the portion A of the second metal films 26b and 28b is made of a material having excellent bonding ability with the conductive material 37, the conductive material 37 adheres to the portion A as indicated by a broken line in FIG. 6, and the neighboring metal films are short-circuited with each other. To prevent this, the Ni films 26b-1 and 28b-1 having poor bonding ability with the conductive material 37 are employed.

The materials for the metal films mentioned above are mere examples. Other materials can be employed for the metal films, as long as the materials have the functions mentioned above.

Figure 7A:
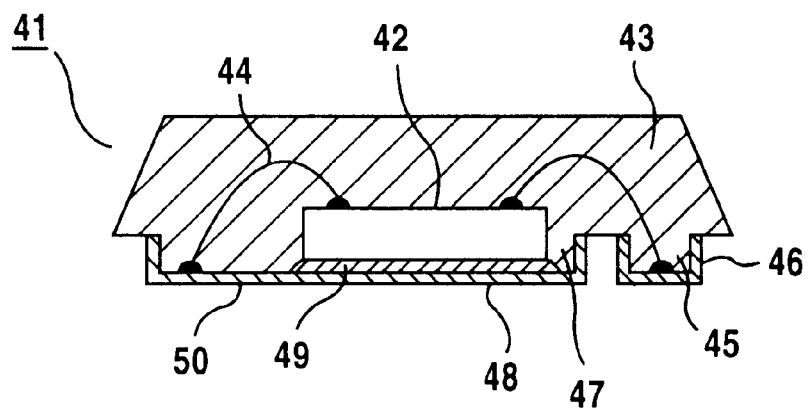
FIGS. 7A and 7B are a sectional view and a perspective view of a semiconductor device of a third embodiment of the present invention.
Figure 7B:
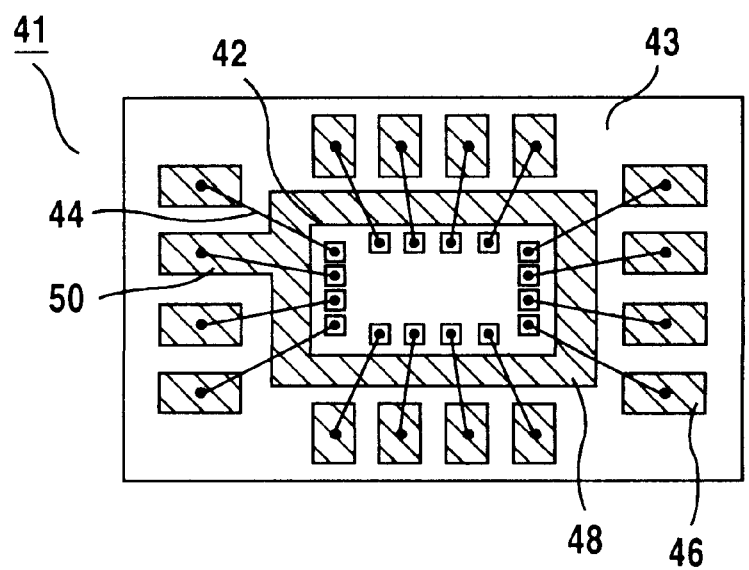

FIGS. 7a and 7B are a sectional view and a perspective view of a semiconductor device of a third embodiment of the present invention.

A semiconductor device 41 of the third embodiment has a semiconductor chip 42 included in a grounding protrusion 47 of a resin package 43, as shown in FIG. 7A. The resin package 43 is provided with mounting protrusions 45 and the grounding protrusion 47. Metal films 46 and 48 cover the surfaces of the mounting protrusions 45 and the grounding protrusion 47.

Signal terminals on the surface of the semiconductor chip 42 and the metal films 46 on the mounting protrusions 45 are electrically connected by wires 44.

The bottom surface of the semiconductor chip 42 sealed in the grounding protrusions 47 of the resin package 43 is in electrical contact with the metal film 48 via a conductive adhesive 49.

As shown in FIG. 7B, the metal film 48 corresponding to the grounding protrusion 47 is formed in the center of the semiconductor device 41, and the metal films 46 corresponding to the mounting protrusions 45 are situated in the surrounding area of the metal film 48. One of the metal films 46 is connected to the metal film 48 by a connecting portion 50.

The connecting portion 50 directly connects the metal films 46 and 48 without wire bonding, so that the metal film 48 of the grounding protrusion 47 can be grounded via the metal film 46 in a case where the metal film 48 is not in electrical contact with the printed circuit board when mounting the semiconductor device 41 onto the printed circuit board.

The above structure can be achieved by changing the resist pattern, which determines the shapes of the concavities and the metal films.

Figure 8A:
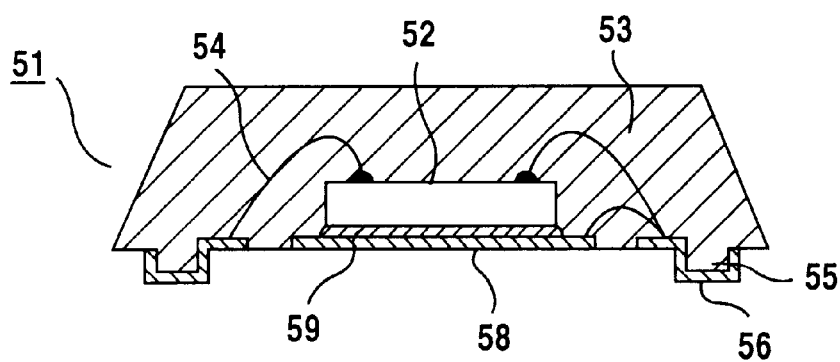
FIGS. 8A and 8B are a sectional view and a perspective view of a semiconductor device of a fourth embodiment of the present invention.
Figure 8B:
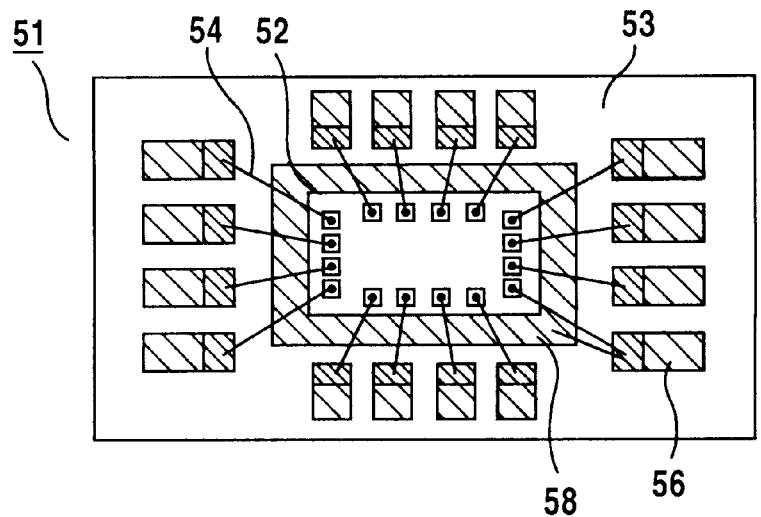

FIGS. 8A and 8B are a sectional view and a perspective view of a semiconductor device of a fourth embodiment of the present invention.

A semiconductor device 51 of the fourth embodiment has a semiconductor chip 52 in the center of the resin package 53 provided with mounting protrusions 55, as shown in FIG. 8A. Metal films 56 and 58 cover the mounting protrusions 55 and the bottom surface of the semiconductor chip mounting surface, respectively.

Signal terminals on the surface of the semiconductor chip 52 are electrically connected to the metal films 56 on the mounting protrusions 55 by wires 54.

The bottom surface of the semiconductor chip 52 sealed in the resin package 53 is in electrical contact with the metal film 58 via a conductive adhesive 59.

As shown in FIG. 8B, the semiconductor chip 52 is situated on the metal film 58 having an outer periphery portion. The metal films 56 corresponding to the mounting protrusions 55 are situated in the surrounding area of the metal film 58. One of the metal films 56 (a grounding terminal) is electrically connected to the metal film 58 by a wire.

Since the metal film 58 for grounding is not in contact with the printed circuit board in the semiconductor device 51 of this embodiment, the metal film 58, which absorbs noise of the semiconductor chip 52, is connected to one of the metal films 56 by the wire. Thus, the noise is released through the metal film 56.

Figure 9A:
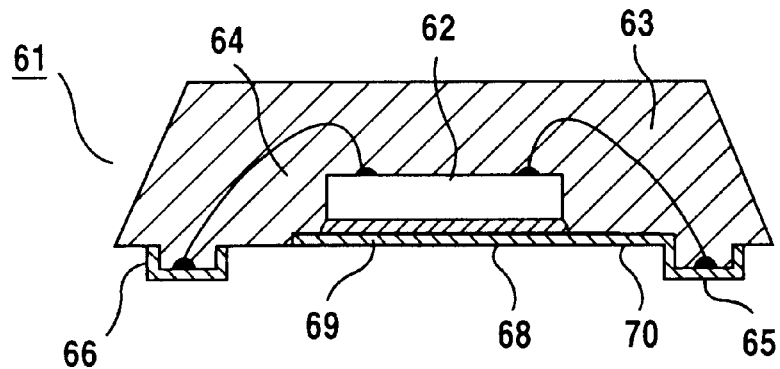
FIGS. 9A and 9B are a sectional view and a perspective view of a semiconductor device of a fifth embodiment of the present invention.
Figure 9B:
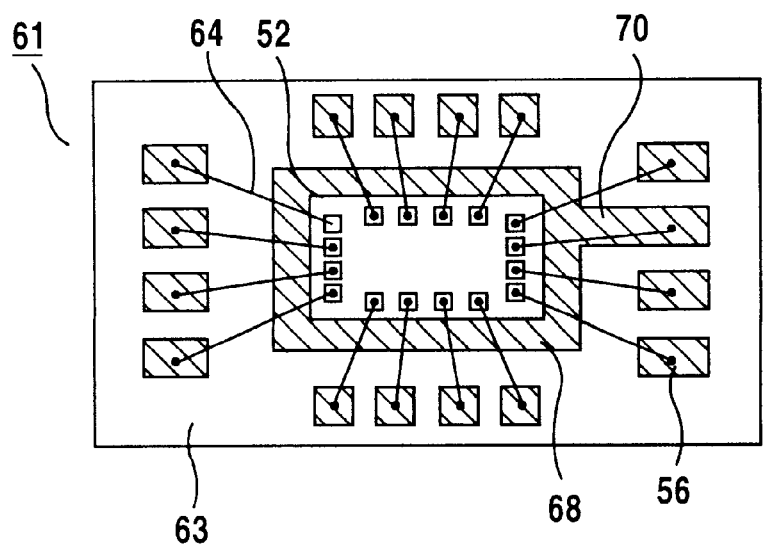

FIGS. 9A and 9B are a sectional view and a perspective view of a semiconductor device of a fifth embodiment of the present invention.

The fifth embodiment is a modification of the fourth embodiment. A semiconductor device 61 of this embodiment has a semiconductor chip 62 in the center of a resin package 63 provided with mounting protrusions 65, as shown in FIG. 9A. Metal films 66 and 68 cover the mounting protrusions 65 and the bottom surface of the semiconductor chip mounting surface, respectively.

Signal terminals on the surface of the semiconductor chip 62 and the metal films 66 on the mounting protrusions 65 are electrically connected by wires 64.

The bottom surface of the semiconductor chip 62 sealed in the resin package 63 is in electrical contact with the metal film 68 via a conductive adhesive 69.

As shown in FIG. 9B, the semiconductor chip 62 is situated on the metal film 68 having an outer periphery portion. The metal films 66 corresponding to the mounting protrusions 65 are situated in the surrounding area of the metal film 68. One of the metal films 66 is electrically connected to the metal film 68 by a connecting portion 70.

The connecting portion 70 serves as the wire in the fourth embodiment, and can be formed by changing the resist pattern in the production process.

Figure 10A:
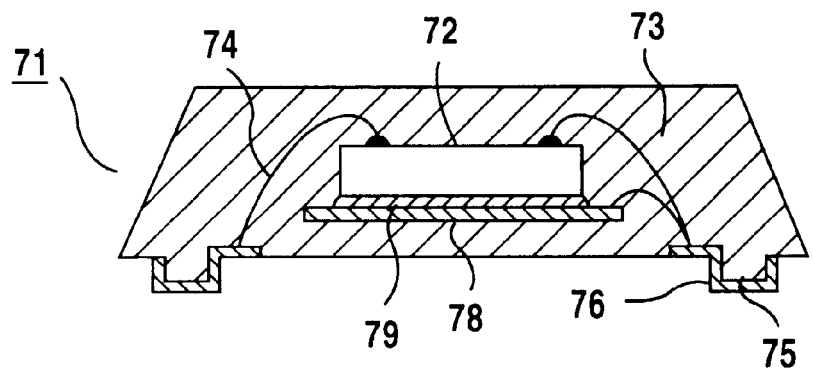
FIGS. 10A and 10B are a sectional view and a perspective view of a semiconductor device of a sixth embodiment of the present invention.
Figure 10B:
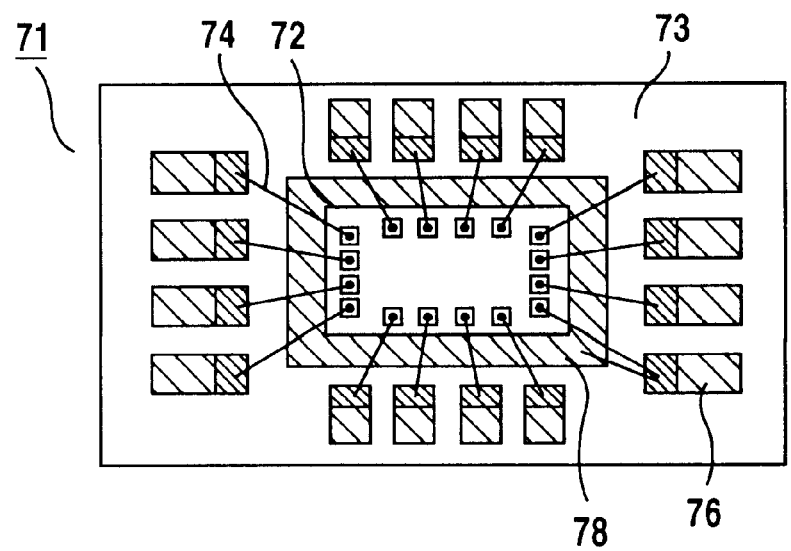
Figure 11A:
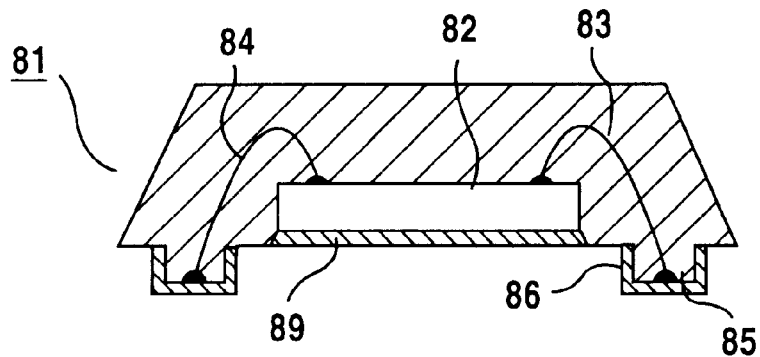
FIGS. 11A and 11B are a sectional view and a perspective view of a semiconductor device of the prior art.
Figure 11B:
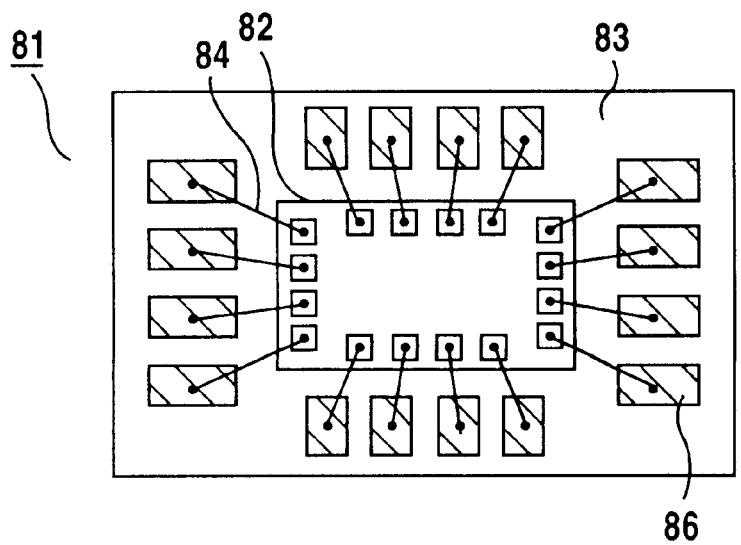
Figure 12:
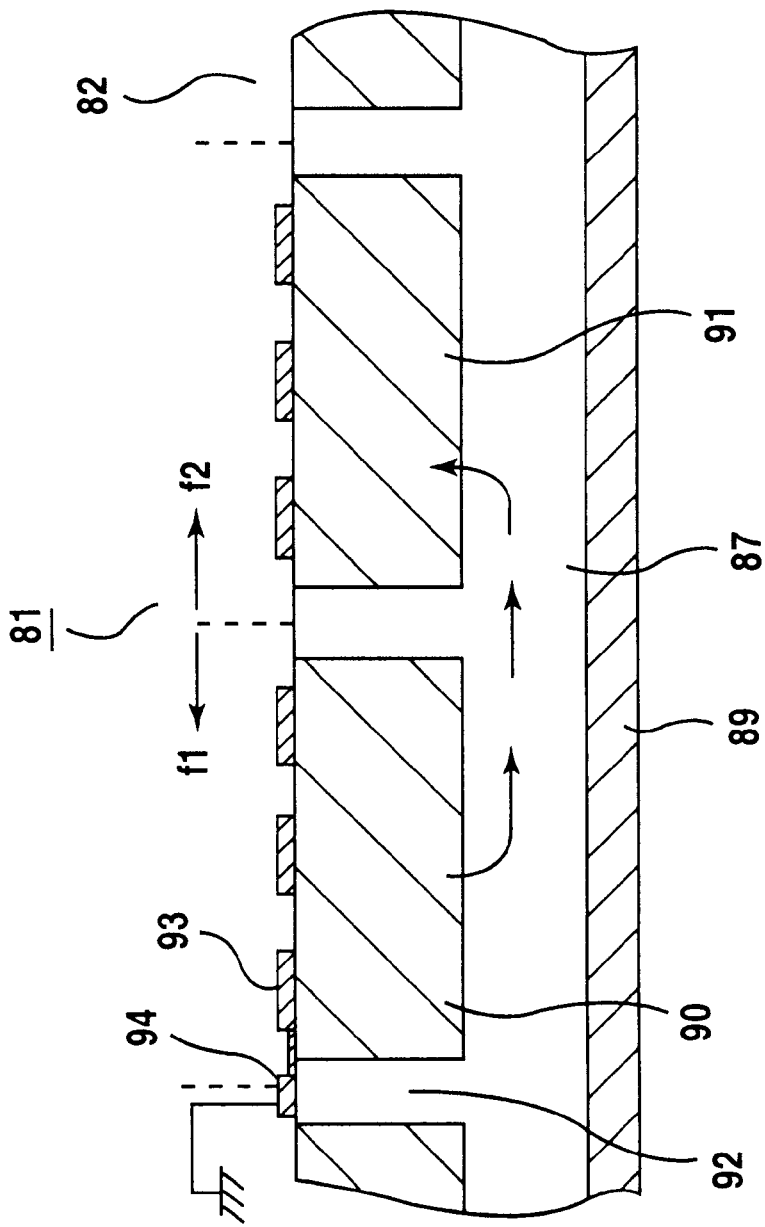
FIG. 12 is a schematic sectional view showing problems in the prior art.

FIGS. 10A and 10B are a sectional view and a perspective view of a semiconductor device of a sixth embodiment of the present invention.

A semiconductor device 71 of the sixth embodiment has a semiconductor chip 72 in the center of a resin package 73 having mounting protrusions 75, as shown in FIG. 10A. The mounting protrusions 75 are covered with metal films 76, and a metal plate 78 is buried in a lower portion of the semiconductor device 72.

Signal terminals on the surface of the semiconductor device 72 and the metal films 76 on the mounting protrusions 75 are electrically connected by wires 74.

The bottom surface of the semiconductor chip 72 sealed in the resin package 73 is in electrical contact with the metal plate 78 via a conductive adhesive 79.

As shown in FIG. 10B, the semiconductor chip 72 is situated on the metal plate 78 with an outer periphery portion, and the metal films 76 corresponding to the mounting protrusions 75 are situated in the surrounding area of the metal plate 78. One of the metal films 78 (a grounding terminal) is electrically connected to the metal plate 78 by a wire.

In this embodiment, the grounding metal plate 78 below the semiconductor chip 72 is not exposed from the surface of the semiconductor device 71, but is buried in the resin package 73. Thus, the semiconductor chip 72 is not adversely influenced by external noise.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 10-183988, filed on Jun. 30, 1998, the entire contents of which are hereby incorporated by reference.

What is claimed is:

1. A semiconductor device comprising:

a semiconductor chip;

a resin package which seals the semiconductor chip;

signal passages which guide signal terminals of the semiconductor chip outward from the resin package;

signal terminals formed on first protrusions of the resin package and connected to the signal passages;

a grounding metal film on a second protrusion of the semiconductor chip, said second protrusion having an area wider than that of the semiconductor chip; and a grounding passage connected to the grounding metal film and guided outward from the resin package.

2. The semiconductor device according to claim 1, wherein a surface of the grounding metal film opposite to a surface thereof in contact with the bottom surface of the semiconductor chip is exposed from the resin package, thereby forming the grounding passage.

3. The semiconductor device according to claim 1, wherein the grounding metal film is connected to a terminal exposed outside the resin package by a conductive wire or a conductive film, thereby forming the grounding passage.

4. The semiconductor device according to claim 1, wherein:

the resin package has a plurality of said first protrusions covered with metal films on a mounting surface thereof; and the metal films covering the first protrusions are connected to the signal terminals of the semiconductor chip by conductive wires, thereby forming the signal passages.

5. The semiconductor device according to claim 4, wherein the metal films are disposed on inner surfaces of the concavities and on flat regions in neighborhood areas of the concavities.

6. The semiconductor device according to claim 4, wherein:

the resin package is provided with a grounding protrusion in an area surrounded by the first protrusions on the mounting surface; and the grounding metal film in contact with the bottom surface of the semiconductor chip is exposed outside the resin package through the grounding protrusion.

7. The semiconductor device according to claim 5, wherein the resin package is provided with a grounding protrusion in an area surrounded by the first protrusions on the mounting surface; and the grounding metal film in contact with the bottom surface of the semiconductor chip is exposed outside the resin package through the grounding protrusion.

8. The semiconductor device according to claim 1, wherein the first and second protrusions are located on a bottom side of the resin package.

* * * * *